US011024611B1

(12) United States Patent
Zou et al.

(10) Patent No.: US 11,024,611 B1
(45) Date of Patent: Jun. 1, 2021

(54) MICRO-LED ARRAY TRANSFER METHOD, MANUFACTURING METHOD AND DISPLAY DEVICE

(71) Applicant: Goertek, Inc., Weifang (CN)

(72) Inventors: Quanbo Zou, Weifang (CN); Peixuan Chen, Weifeng (CN); Xiangxu Feng, Weifang (CN); Tao Gan, Weifang (CN); Xiaoyang Zhang, Weifang (CN); Zhe Wang, Weifang (CN)

(73) Assignee: Goertek, Inc., Weifang (CN)

( * ) Notice: Subject to any disclaimer, the term of this patent is extended or adjusted under 35 U.S.C. 154(b) by 60 days.

(21) Appl. No.: 16/620,224

(22) PCT Filed: Jun. 9, 2017

(86) PCT No.: PCT/CN2017/087774

§ 371 (c)(1),
(2) Date: Dec. 6, 2019

(87) PCT Pub. No.: WO2018/223391

PCT Pub. Date: Dec. 13, 2018

(51) Int. Cl.

| | |
|---|---|
| ***H01L 27/12*** | (2006.01) |
| ***H01L 25/075*** | (2006.01) |
| ***H01L 21/67*** | (2006.01) |
| ***H01L 21/677*** | (2006.01) |
| ***H01L 33/00*** | (2010.01) |
| *H01L 51/00* | (2006.01) |

(Continued)

(52) U.S. Cl.
CPC .... *H01L 25/0753* (2013.01); *H01L 21/67144* (2013.01); *H01L 21/67712* (2013.01); *H01L 21/67721* (2013.01); *H01L 27/1266* (2013.01); *H01L 33/0095* (2013.01); *H01L 21/6835* (2013.01); *H01L 33/0093* (2020.05); *H01L 51/003* (2013.01); *H01L 2021/6006* (2013.01); *H01L 2221/68368* (2013.01); *H01L 2221/68381* (2013.01)

(58) Field of Classification Search
CPC ............. H01L 25/0753; H01L 27/1266; H01L 2221/68368; H01L 21/6835; H01L 51/003
See application file for complete search history.

(56) References Cited

U.S. PATENT DOCUMENTS 8,273,610 B2 * 9/2012 Or-Bach ........... H01L 27/10802 438/142
8,476,145 B2 * 7/2013 Or-Bach ........... H01L 27/10894 438/455

(Continued)

FOREIGN PATENT DOCUMENTS

CN 101488544 A 7/2009
CN 101996892 A 3/2011

(Continued)

*Primary Examiner* — Jarrett J Stark
(74) *Attorney, Agent, or Firm* — Baker Botts, L.L.P.

(57) ABSTRACT

A micro-LED transfer method, manufacturing method and display device are provided. The micro-LED transfer method comprises: bonding the micro-LED array on a first substrate onto a receiving substrate through micro-bumps, wherein the first substrate is laser transparent; applying underfill into a gap between the first substrate and the receiving substrate; irradiating laser onto the micro-LED array from a side of the first substrate to lift-off the micro-LED array from the first substrate; and removing the underfill.

10 Claims, 2 Drawing Sheets

201 207 204 205 208 203 206 202

201 204 205 203 206 202

(51) Int. Cl.
*H01L 21/683* (2006.01)
*H01L 21/60* (2006.01)

(56) References Cited

U.S. PATENT DOCUMENTS 8,536,023 B2 * 9/2013 Or-Bach ........... H01L 21/76254 438/458
8,581,349 B1 * 11/2013 Sekar ................ H01L 29/78696 257/402
8,642,416 B2 * 2/2014 Or-Bach ............. H01L 27/0688 438/199
9,029,173 B2 * 5/2015 Or-Bach ........... H01L 27/11551 438/17
9,219,005 B2 * 12/2015 Or-Bach ........... H01L 27/11526
9,542,638 B2 * 1/2017 Pavate ............. G06K 19/07783
10,319,697 B2 6/2019 Zou et al.
10,964,867 B2 * 3/2021 Brodoceanu ......... B23K 1/0056
2006/0091409 A1 * 5/2006 Epler ...................... H01L 33/48 257/95
2007/0096130 A1 * 5/2007 Schiaffino ........... H01L 33/0093 257/98
2008/0113460 A1 * 5/2008 Shelton ............... H01L 33/0093 438/28
2009/0017566 A1 * 1/2009 Basin ...................... H01L 24/97 438/26
2009/0050921 A1 * 2/2009 Bierhuizen ............... F21K 9/00 257/99
2009/0101929 A1 * 4/2009 Mo ..................... H01L 33/0093 257/98
2009/0140274 A1 * 6/2009 Wierer, Jr. .......... H01L 33/0075 257/97
2009/0230409 A1 * 9/2009 Basin ...................... H01L 24/97 257/88
2010/0019260 A1 * 1/2010 Epler ...................... H01L 33/16 257/98
2010/0224902 A1 * 9/2010 Epler ...................... H01L 33/38 257/99
2010/0283080 A1 * 11/2010 Margalith ............. H01L 33/385 257/99
2010/0320489 A1 * 12/2010 Epler .................. H01L 33/0093 257/98
2011/0012149 A1 * 1/2011 Basin ...................... H01L 33/60 257/98
2011/0018013 A1 * 1/2011 Margalith ............ H01L 27/153 257/91
2011/0108865 A1 * 5/2011 Aldaz ..................... H01L 33/62 257/98
2011/0220934 A1 * 9/2011 Gotoda ................... H01L 33/44 257/98
2013/0087823 A1 * 4/2013 Tsai ........................ H01L 33/38 257/98
2013/0187194 A1 * 7/2013 Wei ....................... H01L 33/005 257/99
2013/0328172 A1 * 12/2013 Tischler .................. H01L 33/62 257/620
2014/0061714 A1 * 3/2014 Lei .......................... H01L 24/14 257/99
2014/0159066 A1 6/2014 Hu et al.
2014/0175481 A1 * 6/2014 Tischler ................ H01L 31/048 257/98
2017/0352778 A1 * 12/2017 Chien ................... H01L 33/502
2018/0269234 A1 * 9/2018 Hughes ............... H01L 27/1248
2018/0275485 A1 * 9/2018 Hurwitz ............... H03H 9/1014
2018/0278228 A1 * 9/2018 Hurwitz ................. H03H 9/564
2018/0278231 A1 * 9/2018 Hurwitz ................. H03H 9/605
2018/0278234 A1 * 9/2018 Hurwitz ............... H03H 9/0523
2019/0392751 A1 * 12/2019 Hsieh ....................... G09G 3/32
2020/0111939 A1 * 4/2020 Brodoceanu ...... H01L 21/67144

FOREIGN PATENT DOCUMENTS

CN 105036066 A 11/2015
CN 105493297 A 4/2016
CN 106058010 A 10/2016
WO WO2016/183844 A1 11/2016

* cited by examiner

MICRO-LED ARRAY TRANSFER METHOD, MANUFACTURING METHOD AND DISPLAY DEVICE

CROSS-REFERENCE TO RELATED APPLICATIONS

This application is a National Stage of International Application No. PCT/CN2017/087774 filed on Jun. 9, 2017 which is hereby incorporated by reference in its entirety.

FIELD OF THE INVENTION

The present invention relates to a method for transferring a micro-LED array, a method for manufacturing a display device and a display device.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LED will have a deep affection on the conventional display products such as LCD/OLED that have already been put into the market.

In the process of manufacturing micro-LEDs, a micro-LED array is first formed on a growth substrate. Then, the micro-LED array is transferred to a receiving substrate, or is transferred to a receiving substrate via a carrier substrate. The receiving substrate is a display screen, for example.

In the prior art, the micro-LED array can be transferred from one substrate to another substrate through laser lifting-off (LLO).

FIG. 1 shows a prior art example of transferring a micro-LED array from a first substrate 101 (a carrier substrate or a growth substrate) to a receiving substrate 102. As shown in FIG. 1, the micro-LED array 104 is formed on the first substrate 101. The micro-LED array 104 is bonded onto the receiving substrate 102. For example, the micro-LED array 104 is bonded onto the anode 106 on top of a TFT (Thin Film Transistor) circuitry 103 formed in the receiving substrate 102 through solder bond 105. The first substrate 101 is laser-transparent. Laser 107 is irradiated from the side of the first substrate 101 onto the micro-LED array 104 to lift-off it.

Since the micro-LEDs in the micro-LED array are of a very small size, the bonding strength between the micro-LEDs and the receiving substrate is very low. Especially, when the resolution of the display device is improved and the micro-LEDs are getting smaller and smaller, the yield loss during transfer is increased.

The bonding strength can be improved when the bonding temperature is elevated. However, the elevated bonding temperature will significantly degrade the bonding quality due to thermal mismatch of the micro-LEDs and the receiving substrate. In this regard, lowered bonding temperature is preferred, especially, for a micro-LED transfer with a large area, where the bonding strength will be a key concern.

Therefore, there is a demand in the art that a new solution for transferring a micro-LED array shall be proposed to address at least one of the problems in the prior art.

SUMMARY OF THE INVENTION

One object of this invention is to provide a new technical solution for transferring a micro-LED array.

According to a first aspect of the present invention, there is provided a method for transferring a micro-LED array, comprising: bonding the micro-LED array on a first substrate onto a receiving substrate through micro-bumps, wherein the first substrate is laser transparent; applying underfill into a gap between the first substrate and the receiving substrate; irradiating laser onto the micro-LED array from a side of the first substrate to lift-off the micro-LED array from the first substrate; and removing the underfill.

Alternatively or optionally, the method further comprises: separating the first substrate from the receiving substrate.

Alternatively or optionally, the first substrate is a sapphire substrate.

Alternatively or optionally, the micro-bumps are of low temperature bonding material.

Alternatively or optionally, the underfill is at least one of is a low viscosity liquid, solvent, resist, glue, polymer, silicone and grease.

Alternatively or optionally, the underfill is solidified or the viscosity of the underfill is increased during the micro-LED array is lifted-off.

Alternatively or optionally, the underfill is applied in a low atmospheric pressure environment or in vacuum.

Alternatively or optionally, the underfill is removed by chemical, solvent, undercutting or phase change.

According to a second aspect of the present invention, there is provided method for manufacturing a display device, comprising transferring a micro-LED array from a first substrate to a receiving substrate of the display device by using the method for transferring a micro-LED array according to an embodiment.

According to a third aspect of the present invention, there is provided display device manufactured by using the method for manufacturing a display device according to an embodiment.

According to an embodiment, the bonding strength may be improved during a transfer of a micro-LED array.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
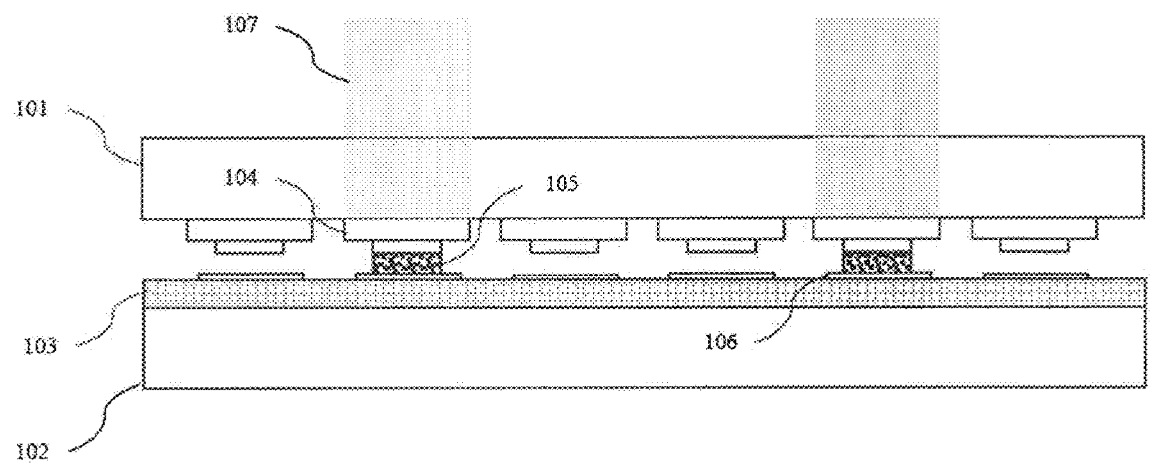
FIG. 1 shows a schematic diagram of a prior art example of transferring a micro-LED array through laser lifting-off.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In an embodiment, it is proposed to apply an underfill during a LLO transfer of a micro-LED array to improve the bonding strength between the micro-LED array. The underfill can be removed after the transfer.

FIGS. 2-5 shows a schematic diagram of a process of transferring a micro-LED array from a first substrate to a receiving substrate according to an embodiment.

Figure 2:
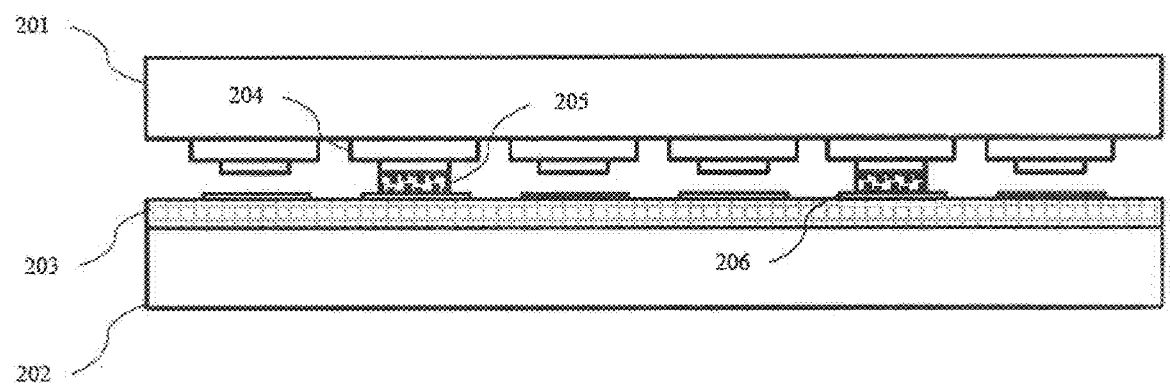
FIGS. 2-5 shows a schematic diagram of a process of transferring a micro-LED array from a first substrate to a receiving substrate according to an embodiment.

As shown in FIG. 2, the micro-LED array 204 on a first substrate 201 is bonded onto a receiving substrate 202 through micro-bumps 206. The first substrate 201 is laser transparent. For example, it is a sapphire substrate.

The micro bumps 206 may be anodes on top of the circuitry 203 such as a TFT circuitry in the receiving substrate 202. For example, the micro-LEDs 204 are bonded on the micro-bumps 206 through solder 205.

For example, the micro-bumps 206 are of low temperature bonding material, such as In, Sn or other low temperature metals/alloys. It can also be electrical conductive adhesives or resists.

Figure 3:
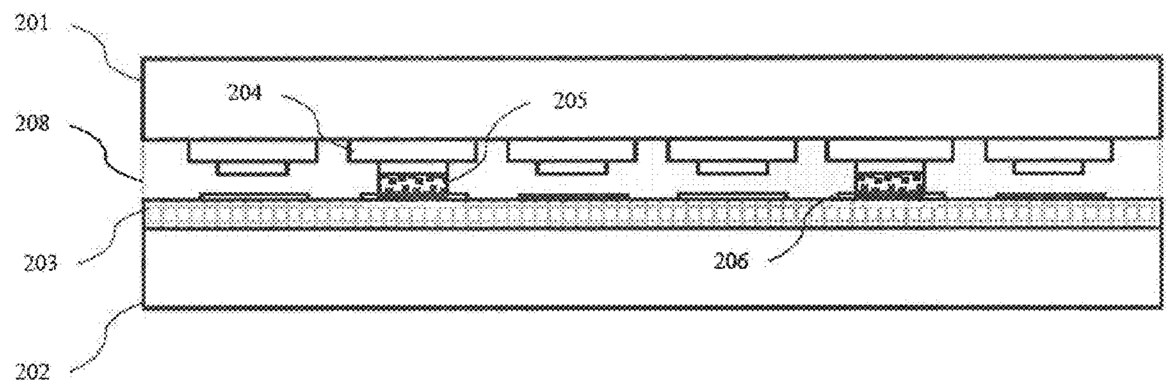

As shown in FIG. 3, underfill 208 is applied into a gap between the first substrate 201 and the receiving substrate 202. For example, the underfill is applied by capillary. The underfill can act as a protection layer for the micro-LEDs 204 and the receiving substrate 202 during the laser lifting-off.

For example, the underfill 208 can be at least one of is a low viscosity liquid, solvent, resist, glue, polymer, silicone and grease.

In an example, the underfill 208 is applied in a low atmospheric pressure environment or in vacuum. In this way, the bubbles or air in the underfill can be gotten rid of.

Figure 4:
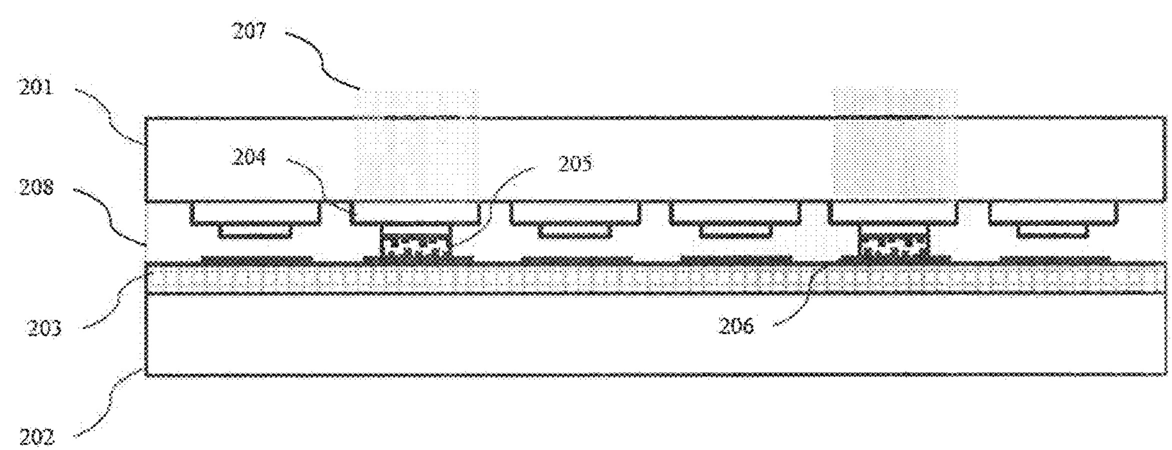

As shown in FIG. 4, laser 207 is irradiated onto the micro-LED array from a side of the first substrate to lift-off the micro-LED array from the first substrate.

In FIG. 4, the laser 207 is irradiated onto selected micro-LEDs 204. The selected micro-LEDs constitute the micro-LED array 204 which is to be transferred to the receiving substrate 202.

In an example, the underfill is applied in an elevated temperature. The elevated temperature is not as high as that causing a significant thermal mismatch. Then, the underfill is solidified or the viscosity of the underfill is increased during the micro-LED array is lifted-off.

Alternatively, the underfill will not be solidified or the viscosity thereof will not be increased. This will simplify the processing.

Here, a temporary underfill 208 is added into gap between the first substrate 201 and the receiving substrate 202. The underfill will mechanically enhance the bonding between the two substrates. Thus, the yield will significantly be improved LLO yield.

In addition, the underfill can also function as a protection layer for the receiving substrate during the laser lifting-off. For example, it prevents the laser from irradiating onto the receiving substrate 202, which may damage the circuitry 203 in the receiving substrate 202.

Here, the underfill will reinforce the bonding strength between the micro-LEDs and the receiving substrate, without a high temperature/high strength bonding. This will reduce the negative influence caused by a thermal mismatch between the micro-LEDs and the receiving substrate.

The underfill can be low viscosity resist, polymer, silicone, glue or grease, or it can even be liquid, such as water, solvent. The underfill can be applied into the gap by capillary force due to surface tension.

Figure 5:
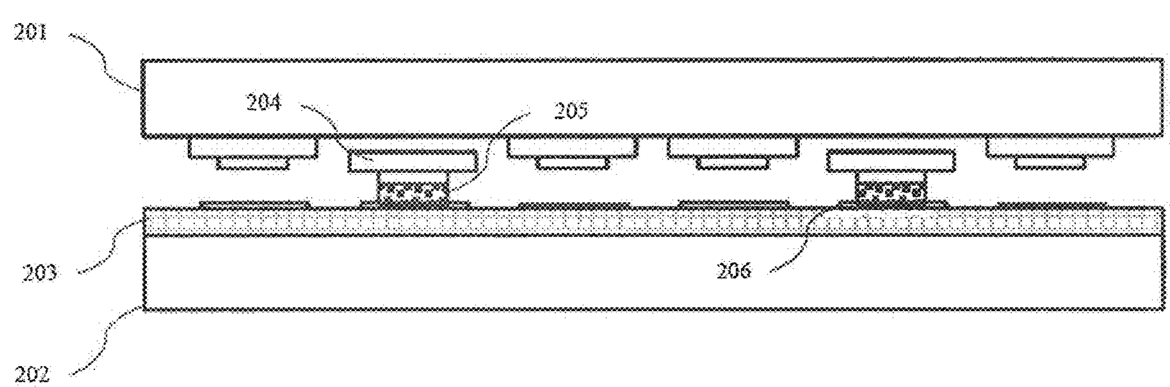

As shown in FIG. 5, the underfill 208 is removed. For example the underfill is removed by chemical, solvent, undercutting or phase change. Then, it is rinsed and dried.

Next, the first substrate 201 is separated from the receiving substrate 202.

In another embodiment, an embodiment includes a method for manufacturing a display device. The manufacturing method comprises transferring a micro-LED array from a first substrate to a receiving substrate of the display device by using the method for transferring a micro-LED array according to an embodiment as above. The display device can be a display panel, a display screen and so on.

In another embodiment, another embodiment includes a display device manufactured by using the method for manufacturing a display device according to an embodiment as above.

In comparison with the prior art, since the underfill can improve the bonding strength during the laser lifting-off and/or can be a protection layer for the receiving substrate, the display device will show a better performance than one of the prior art under a similar condition.

In another embodiment, another embodiment can further include an electronic apparatus. The electronic apparatus contains a display device as above. For example, the electronic apparatus can be a mobile phone, a pad computer and so on.

Although some specific embodiments of the present invention have been demonstrated in detail with examples, it should be understood by a person skilled in the art that the above examples are only intended to be illustrative but not to limit the scope of the present invention.

What is claimed is:

1. A method for transferring a micro-LED array, comprising:

bonding the micro-LED array on a first substrate onto a receiving substrate through a plurality of micro-bumps, wherein the first substrate is laser transparent;

applying an underfill into a gap between the first substrate and the receiving substrate;

irradiating the micro-LED array with a laser from a side of the first substrate to lift-off the micro-LED array from the first substrate; and removing the underfill.

2. The method according to claim 1, further comprising:

separating the first substrate from the receiving substrate.

3. The method according to claim 1, wherein the first substrate is a sapphire substrate.

4. The method according to claim 1, wherein the micro-bumps are of low temperature bonding material.

5. The method according to claim 1, wherein the underfill is selected from the group consisting of a low viscosity liquid, solvent, resist, glue, polymer, silicone and grease.

6. The method according to claim 1, wherein the underfill is solidified or a viscosity of the underfill is increased during the irradiating.

7. The method according to claim 1, wherein the underfill is applied in a low atmospheric pressure environment or in a vacuum.

8. The method according to claim 1, wherein the underfill is removed by one or more of a chemical, solvent, undercutting or phase change.

9. A method for manufacturing a display device, comprising transferring a micro-LED array from a first substrate to a receiving substrate of the display device by using the method according to claim 1.

10. A display device manufactured by using the method for manufacturing a display device according to claim 9.

* * * * *